(12) United States Patent
Lenssens et al.

(10) Patent No.: US 12,607,939 B2
(45) Date of Patent: Apr. 21, 2026

(54) METHOD AND SYSTEM TO DETERMINE AN EXPOSURE TIME AND/OR INTENSITY TO BE USED FOR OBTAINING A DESIRED FEATURE OF A RELIEF STRUCTURE

(71) Applicant: XSYS PREPRESS NV, Ypres (BE)

(72) Inventors: Pieter Lenssens, Zottegem (BE); Dirk Ludo Julien De Rauw, Ninove (BE); Daniel Fleischer, Rheinau (DE)

(73) Assignee: XSYS PREPRESS NV, Ypres (BE)

( * ) Notice: Subject to any disclaimer, the term of this patent is extended or adjusted under 35 U.S.C. 154(b) by 506 days.

(21) Appl. No.: 18/027,274

(22) PCT Filed: Oct. 4, 2021

(86) PCT No.: PCT/EP2021/077300
§ 371 (c)(1),
(2) Date: Mar. 20, 2023

(87) PCT Pub. No.: WO2022/069767
PCT Pub. Date: Apr. 7, 2022

(65) Prior Publication Data
US 2023/0367222 A1 Nov. 16, 2023

(30) Foreign Application Priority Data
Oct. 2, 2020 (NL) ..................................... 2026610

(51) Int. Cl.
*G03F 7/20* (2006.01)
*G03F 7/00* (2006.01)

(52) U.S. Cl.
CPC ........ *G03F 7/2022* (2013.01); *G03F 7/70525* (2013.01); *G03F 7/7055* (2013.01); *G03F 7/70625* (2013.01)

(58) Field of Classification Search
CPC .. G03F 7/2022; G03F 7/70525; G03F 7/7055; G03F 7/70625; G03F 7/2004; G03F 7/201; G03F 7/2014; G03F 7/36
(Continued)

(56) References Cited

U.S. PATENT DOCUMENTS

2003/0129533 A1 7/2003 Goodin
2008/0314271 A1* 12/2008 Goldfarb ............. G03F 7/70625
101/401.1
(Continued)

FOREIGN PATENT DOCUMENTS

CN 101446769 A 6/2009
EP 0356952 A2 3/1990
(Continued)

OTHER PUBLICATIONS

International Search Report and Written Opinion mailed Nov. 11, 2022, for Application No. PCT/EP2021/077300 (14 pages).

*Primary Examiner* — Caleen O Sullivan
(74) *Attorney, Agent, or Firm* — KDW Firm PLLC

(57) ABSTRACT

A method to determine an exposure time and/or intensity to be used for obtaining a desired feature of a relief structure, in particular a desired floor thickness, includes exposing a first side of a relief precursor with electromagnetic radiation, where the exposure is done in an area having a first position A and a second position B and is performed such that for a plurality of points between said first and second positions A, B the values for the exposure time and the exposure intensity are known, wherein the exposure time and/or the exposure intensity are automatically controlled to be varied at said plurality of points; determining one or more points of said plurality of points representative for the desired feature; and determining the required exposure time and/or exposure
(Continued)

intensity for the desired feature based on the determined one
or more points and the known values.

20 Claims, 10 Drawing Sheets

(58) Field of Classification Search
    USPC .......................................................... 430/30
    See application file for complete search history.

(56)                        References Cited

U.S. PATENT DOCUMENTS

| | | |
|---|---|---|
| 2009/0157360 A1 | 6/2009 | Ye et al. |
| 2015/0030984 A1 | 1/2015 | Ramakrishnan |

FOREIGN PATENT DOCUMENTS

| | | |
|---|---|---|
| EP | 2009502 A2 | 12/2008 |
| JP | H2108632 A | 4/1990 |
| JP | 2003156854 A | 5/2003 |
| JP | 2006512758 A | 4/2006 |
| JP | 200923343 A | 2/2009 |
| JP | 2009141352 A | 6/2009 |
| JP | 201469575 A | 4/2014 |
| WO | 2004059394 A2 | 7/2004 |
| WO | 2018172374 A1 | 9/2018 |

* cited by examiner

METHOD AND SYSTEM TO DETERMINE AN EXPOSURE TIME AND/OR INTENSITY TO BE USED FOR OBTAINING A DESIRED FEATURE OF A RELIEF STRUCTURE

This application is a national stage filing under 35 U.S.C. 371 of pending International Application No. PCT/EP2021/077300, filed Oct. 4, 2021, which claims priority to Netherlands Patent Application No. 2026610, filed Oct. 2, 2020, the entirety of which applications are incorporated by reference herein.

FIELD OF INVENTION

The field of the invention relates to a method and system to determine exposure conditions, in particular an exposure time and/or exposure intensity to be used for obtaining a desired feature of a relief structure, more in particular a desired floor thickness of a printing plate or printing sleeve.

BACKGROUND

Relief structures can be made by transfer of image information onto an imagable layer and removing parts of the imagable layer. The formed relief may then be used to transfer the information in a printing step onto a substrate.

Exemplary relief precursors are printing plate or printing sleeve precursors. Digitally imagable flexible printing precursors are known, and typically comprise at least a dimensionally stable support layer, a photosensitive layer and a digitally imagable layer. In case of conventional printing precursors, the digitally imagable layer is a mask layer attached to a photosensitive layer. In the digital image plate said layer may be for example a laser-ablatable layer.

To produce the relief structure, the relief precursor is exposed to electromagnetic radiation and developed by removing non-exposed material.

Exposure systems for printing precursors are known. An exposure system may comprise a radiation means for front exposure and/or a radiation means for back exposure. Back exposure is performed though the dimensionally stable support and results in a floor permanently fixed to the support. Back exposure is typically done using a set of UV light tubes. The back exposure creates a solid layer (floor) onto which relief features may be generated. Front exposure may also be done using a set of UV light tubes or may be done using a movable UV radiation source, such as a movable laser or a LED bar.

However, the right exposure conditions need to be known, in particular for the back exposure of relief precursors, more in particular in order to obtain a desired floor thickness. Prior art methods to determine exposure conditions usually depend on external means which are complex, error-prone and take a long time. Hence there is a need in the art to improve on said determination methods.

SUMMARY OF THE INVENTION

The object of embodiments of the invention is to provide an improved system and method to determine exposure conditions of a relief precursor, in particular an exposure time and/or exposure intensity to be used for obtaining a desired feature of a relief structure, in particular a desired floor thickness of a printing plate or printing sleeve. More in particular, the object is to provide a method and system allowing a faster and more reliable determination of the exposure conditions to obtain the desired feature without the need of complex tools or cumbersome handling of the relief precursor.

According to a first aspect of the invention, there is provided a method to determine an exposure time and/or exposure intensity to be used for obtaining a desired feature of a relief structure, in particular a desired floor thickness. The method comprising the following steps:

exposing a first side of a relief precursor with electromagnetic radiation wherein the exposure is done in an area having a first position A and a second position B and is performed such that for a plurality of points between said first and second positions A, B the values for the exposure time and the exposure intensity are known and wherein the exposure time and/or the exposure intensity are automatically controlled to be different for said plurality of points;

optionally exposing a second side of the relief precursor in a portion between the first position A and the second position B;

optionally developing the relief precursor by removing non-exposed material thereof, optionally drying of the developed relief precursor, optionally curing of the developed relief precursor, determining one or more points of said plurality of points representative for the desired feature;

determining the required exposure time and/or exposure intensity for the desired feature based on the determined one or more points and the known values.

Such a method determines exposure conditions in a way that is more reliable and less prone to measuring errors, compared to prior art methods. By exposing a series of points with a different exposure time and/or exposure intensity, an exposed profile is obtained which allows accurately identifying a desired feature in the developed relief precursor, such as a desired floor thickness, and using the associated known values for performing a subsequent exposure of a relief precursor. Also, the method can simply be performed by the exposure system, and the step of determining one or more points representative for the desired feature can be done using simple means.

The determining of the required exposure time and/or exposure intensity for the desired feature may be done by any or a combination of the following: selecting, calculating or deriving. For example, if a point of the determined one or more points corresponds exactly with desired feature, then the known value corresponding with this point may be selected. In another example, if two points are close to the desired feature, an average of the known values corresponding with those two points may be calculated.

Preferably, the step of determining one or more points of said plurality of points representative for the desired feature is done after developing the relief precursor. Additionally, other steps such as a pre- and/or post-treatment step may be done before the step of determining one or more points of said plurality of points representative for the desired feature. Such a pre-treatment step may comprise e.g. a pre-washing of the printing plate. Post-treatment steps can be a rinsing step, a drying step, a post exposure step e.g. using UVA and/or UVC light, a thermal treatment step and combinations thereof. More generally, any step normally performed when manufacturing relief precursors may also be performed during the calibration method for determining an exposure time and/or exposure intensity to be used for obtaining a desired feature of a relief structure.

It is further noted that various development conditions will influence the features of the developed relief precursor, such as the solvent used, the temperature, the wash-out speed, etc. When any of those conditions is changed, the calibration method may be repeated.

According to a preferred embodiment, the first side of the relief precursor is the backside of the precursor and the desired feature is the floor thickness of a developed relief precursor.

According to an exemplary embodiment, the exposing is done continuously in a direction between positions A and B, preferably a direction extending in a length direction of the relief precursor, thereby forming a continuously exposed area between the first and second positions A and B. A continuous exposed area results in a more efficient use of the area available on the relief precursor to expose. Further, the accuracy can be higher. Because a high accuracy can be obtained with a single relief precursor, less waste is formed in terms of the relief precursor, and later on less leftover of the non-exposed material, especially in the developing step when the non-exposed material is removed.

According to an exemplary embodiment, the exposure time and/or the exposure intensity are controlled automatically to be different for said plurality of points. In this manner, a more efficient and faster process is achieved with a reduced need of manual handling steps. The skilled person understands that several combinations of exposure time and/or exposure intensity can be made for said plurality of points. The values for the exposure time and/or the exposure intensity are controlled to be varied for said plurality of points. Preferably, the exposure time and exposure intensity are controlled such that they are different as seen along a line connecting the first and second position A and B. Controlling the exposure time and/or the exposure intensity automatically to be different for said plurality of points, implies that this step may be performed based on programmed instructions without the need for the operator to manually perform actions during the exposure. For example, the intensity may be adjusted automatically using computer instructions and/or the exposure time may be adjusted automatically using computer instructions.

According to an exemplary embodiment, the exposure time and the exposure intensity are known as a function of a position along a line between the first and second positions A and B, preferably a continuous function. A continuous exposed area without interruptions or discontinuities results in the efficient use of available exposable area of the relief precursor.

According to an exemplary embodiment, the function is a linear function or a step function, resulting, after developing, in a wedge shaped portion or a portion comprising a plurality of steps. Alternatively, the function is a more complex function that may result in a more complex shape such as a wave, a hyperbolic function, a polynomial function or a series of slopes. Further, it is noted that the exposure time and/or exposure intensity may be varied in two dimensions in the area between the first and the second position. In that way even more complex shapes, such as a pyramid or a cone shape of the floor can be obtained.

According to an exemplary embodiment, the method further comprises the exposing of a first reference area from the first side during a maximum exposure time before the developing the precursor, at a predetermined intensity and/or not exposing a second reference area from the first side. The first reference area will have a photosensitive layer of the relief precursor fully cured and the floor thickness will correspond to the thickness of the photosensitive layer. The second reference area will have no cured material and represents a floor thickness of zero. In the case wherein material is present in the second reference area, the proper developing conditions are not met and may need to be corrected. The method further comprises, after developing the relief precursor, checking the first and/or second reference area, and optionally based thereon determining a correction factor if needed.

According to an exemplary embodiment, the second reference area is covered by a layer which is non-transparent for electromagnetic radiation. In doing so, the covered area of the relief precursor will not be prone to radiation. It follows that the non-exposed material located at the second area will be removed during the developing of the precursor. Hence, with no material present at said second area it may be used as a reference when measuring the desired feature, preferably the floor thickness.

According to an exemplary embodiment, the method further comprises, before the developing step, exposing a third reference area from the second side during a predetermined exposure time at a predetermined intensity and, after the developing step, checking the third reference area, and optionally based thereon determining a correction factor if needed.

According to an exemplary embodiment, the second side of the precursor is covered by a layer which is non-transparent for electromagnetic radiation, but the third reference area is not covered by the layer. Or the layer is transparent to electromagnetic radiation in the area above the third reference area and non-transparent in the rest of the area of the layer covering the second side. The third reference area optionally overlaps at least partially with the exposed area between positions A and B and/or with the first or second reference area.

Optionally, based on the checking of the first and/or second and/or third reference areas, a correction factor is determined. Later on, the correction factor can be used in order to determine and/or correct any errors or deficiencies of the measured thickness. This would especially be desirable when any non-exposed or undeveloped material would be left after the developing of the relief precursor. Alternatively, the first, second and/or third reference area can be used for calibration when determining the one or more points of the plurality of points that represent the desired feature.

According to an exemplary embodiment, the exposure intensity is constant and the exposure time is varied during the step of exposing. A longer exposure time at a certain area results in a larger thickness in comparison with a smaller exposure time at another area when the intensity for both areas is kept constant.

According to an exemplary embodiment, the method further comprises exposing the relief precursor with an exposure unit comprising an electromagnetic radiation source and a movable shutter between the relief precursor and the electromagnetic radiation source, wherein during the step of exposing, the exposure time is controlled by relative movement of the shutter relative to the relief precursor, wherein the relative movement is preferably parallel to the relief precursor.

Preferably, the shutter is moved from a start position where the shutter shields the area between the first position A and the second position B, in the direction of the second position B to an end position in which the shutter allows full exposure of the area between the first and second positions A and B. In this manner, the exposure time in a plurality of points between said first and second positions A, B is varied. The shutter may be moved at a constant speed resulting in a relief precursor with a linear thickness profile, preferably a wedge profile. Alternatively, the shutter may remain fixed for a certain amount of time between the start and end position creating a relief precursor with a step profile. In yet other embodiments, the speed of the shutter may be varied in a continuous or discontinuous manner between the start and the end position.

According to another exemplary embodiment, the intensity is varied by exposing different areas between first and second positions A and B with a different exposure intensity. In doing so, the areas subject to a higher intensity develop a larger thickness in comparison with the areas that are subject to a lower intensity. This may be achieved for example by using a LED bar for back side exposure which is moved to several positions in between positions A and B and controlled such that at each position for a fixed time different intensities are delivered. Another possibility is to move the LED bar at constant speed and change the intensity either continuously or step wise. In a further setup a LED array or set of light tubes covering the whole size of the precursor can be used and certain LEDs or tubes belonging to areas of the array are controlled such that different areas deliver different intensities.

Another way of changing the intensity is to use one or more radiation control layers configured for at least partially blocking or reducing radiation emitted by the electromagnetic radiation source to the relief precursor. For example, the radiation control layer may be configured to be more transparent in certain areas of the layer and less transparent in other areas. Alternatively or in addition, multiple radiation control layers having a different degree of transparency (e.g. multiple tiles arranged next to each other on the relief precursor) may be used. Thereby, the one or more radiation control layers are able to control the exposure intensities to which the relief precursor is subjected to. The radiation control layer may be a film with areas of different optical density and where the intensity passing through the different areas is known. Such transmission step wedges are available e.g. from Stouffer Industries, Agfa or Kodak. When using a radiation control layer with areas with different optical densities a larger number of different intensities can be applied in one single exposure step which saves time and material. Another possibility for a radiation control layer is to use a mask film wherein areas with different tonal values are represented. Such mask films can be obtained by ablating a non-transparent mask layer of by changing the transparency of a layer. The structure of the areas could be transparent lines or dots with a certain size and number per unit area such that only a defined portion of the applied light my pass. Such mask films are available e.g. form Miraclon (Flexcel) or Folex (LADF). In yet another embodiment a pattern of tiles is used comprising a first tile having a first know transparency and a second tile having a second known transparency different from the first transparency.

According to an exemplary embodiment, the developing of the relief precursor is done by treating the non-exposed material using a fluid and/or by heating the exposed precursor and transferring the non-exposed material to another material, preferably a non-woven web. In doing so, the non-exposed material is removed leaving the developed relief precursor of which a desired feature, and in particular a thickness may be measured and/or identified. The development step may be performed in an in-line configuration wherein the precursor is automatically moved from the exposure station to the developing station or it may be performed in standalone devices where the precursor is moved manually. It is clear that during the calibration method preferably the same conditions for the developing step and/or other steps impacting the desired feature are used which shall be employed in the production of relief structures. Steps which may impact the desired feature are for example pre-treatment steps and/or post-treatment steps.

Preferably, the determining of one or more points of said plurality of points representative for the desired feature is done in the same position of the relief precursor as the position in which is was subjected to the exposing step. Thus, preferably the determining is done by measuring the one or more points without moving the relief precursor after the step of exposing.

According to an exemplary embodiment, the thickness of the developed precursor is measured in a plurality of points between first and second positions A and B. Thereby, a thickness profile is obtained. The determining of the one or more points, of the plurality of points, which represent a desired feature may then be based on said thickness profile. Preferably, the thickness profile is a wedge profile. A skilled person understands that different profiles are possible, for example a wave, a series of triangles, staircase step profile. The thickness may be measured by any one of the following methods: mechanical, optical and/or acoustic methods, preferably a non-contact method. The determination of the floor thickness may be performed in a separate device but in a preferred method it is implemented in the exposure unit. When implemented in the exposure unit the developed precursor may be positioned at exactly the same location as during the exposure whereby the thickness values can be related to the exact position and exposure conditions performed. In order to obtain best results the re-positioning of the precursor registration marks or other positioning tools may be used. This will reduce measurement errors.

The relief precursor has a length direction and a width direction. Preferably, the first and second positions correspond with a first and second edge extending in the width direction of the relief precursor. Alternatively, the first and second positions may correspond with edges extending in a length direction or in a direction at an angle different from 90° with respect to the width direction. Also, the corresponding edges may be curved.

According to an exemplary embodiment, the exposing is performed such that a developed relief precursor having substantially the shape of a wedge is obtained. Said shape results in an easy to handle and convenient shape having different thicknesses at a plurality of points between a top and bottom position of the wedge. Thereby, a shape is provided with a large number of different thicknesses from which the corresponding exposure conditions may be derived.

According to an exemplary embodiment, the determining of one or more points of said plurality of points representative for the desired feature comprises measuring a thickness of the developed relief precursor by any one of the following methods: mechanical, optical and/or acoustic methods, preferably a non-contact method. Alternatively, the thickness may be measured without developing the relief precursor. The latter may be done for example by non-contact acoustic methods which detect a difference in densities.

From the results of the previous steps one can select the exposure conditions for a desired floor thickness. These selected conditions are then used for production of relief structures with the desired floor thickness.

According to an another aspect of the invention a method is provided for manufacturing a relief structure comprising performing any one of the embodiments of the method as described above, including determining, e.g. selecting, the exposure time and/or exposure intensity for a desired feature such as a desired floor thickness and use of the selected exposure time and/or exposure intensity for the manufacturing of relief structures.

Preferably, the relief structure is a flexographic printing plate, a letter press plate, a relief printing plate, a (flexible) printed circuit board, an electronic element, a microfluidic element, a micro reactor, a phoretic cell, a photonic crystal, an optical element or a Fresnel lens.

According to a another aspect of the invention, there is provided a system which is configured to determine the exposure time and/or exposure intensity to use in the exposure of a relief precursor, in order to obtain a desired feature of a relief structure, in particular the desired floor thickness. The system comprises a holding means, an exposure unit, a control module, a measuring unit and a determining module. The holding means is configured to support the relief precursor of which the first side is to be exposed by the exposure unit with electromagnetic radiation between a first position A and a second position B of the precursor. Optionally, the exposure unit is configured to expose a second side of the precursor between said positions. The control module is configured to control the values for the exposure, in particular the exposure time and/or the intensity, for a plurality of points between the first and second position such that the exposure time and/or the exposure intensity are varied automatically for said plurality of points. The optional development unit is configured to develop the exposed relief precursor in order to remove unexposed material. The measuring unit is configured to measure the developed relief precursor in order to determine one or more points of said plurality of points which represent the desired feature. The determining module is configured to determine the required exposure time and/or intensity in order to obtain the desired feature based on the determined one or more points and the values which are set by the control module. Additionally, the system may comprise pre-treatment and/or post-treatment means which are set up for pre- and/or post-treating the relief precursor with for example a pre-wash.

The system allows a faster and more reliable determination of the exposure conditions to be used in order to obtain a desired feature, preferably a desired floor thickness, without the need of complex tools or cumbersome handling of the relief precursor. Furthermore, the system may be used to follow up the development stability and/or exposing efficiency of a developing process of relief precursor, preferably a polymer printing plate or sleeve.

The exposing may be a back-exposure for curing a polymer printing plate or sleeve precursor, in order to achieve a stable backside floor structure. It is desirable to achieve a backside floor structure with a constant chosen thickness, hence the right exposure conditions, such as exposure intensity and exposure time need to be known. By providing a determining module to determine said conditions based on the one or more points, measured by the measuring unit, and the associated one or more values set by the control module, the exposure conditions to achieve the desired feature may be derived. In doing so, the accuracy of deriving the desired feature may be increased.

According to a preferred embodiment, the exposure unit comprises a back exposure means configured to expose the backside of the relief precursor and the desired feature is a desired floor thickness.

According to an exemplary embodiment, the control module is configured to control the exposure unit such that the exposing is done continuously in a direction between the first and second positions, preferably a direction extending in a length direction L of the relief precursor, thereby forming a continuously exposed area between the first and second positions. A skilled person understands that the control module may also be configured to control the exposure unit to expose in other directions, for example the width direction or a direction at an angle different from 90° with respect to the width direction. A continuous exposing results in a more efficient use of the exposable area available on the relief precursor. In so doing, less area of the relief precursor is wasted, more in particular less non-exposed material is to be removed, especially in the developing step when the non-exposed material is removed.

According to an exemplary embodiment, the determining module is configured to receive the exposure time and the exposure intensity as a function of a position along a line between the first and second positions of the precursor. In this way, the values of the exposure time and exposure intensity can be associated with a position on the relief precursor.

According to an exemplary embodiment, the function received by the determining module is a linear function or a step function. A skilled person understands that other functions that may result in more complex shapes are also possible. For example the shape may be a wave, a series of triangles or hill shape. Further, it is noted that the exposure time and/or exposure intensity may be varied in two dimensions between the first and the second position resulting in even more complex shapes, such as a pyramid or a cone shape.

According to an exemplary embodiment, the exposure unit comprises an electromagnetic radiation source and one or more radiation control layers configured for at least partially blocking or reducing radiation emitted by the electromagnetic radiation source to the one or more radiation control layers. In this manner, the radiation source may be of one type, radiating one type of intensity towards the relief precursor, while the relief precursor receives different intensities in a plurality of points thereof. For example, there may be provided a single radiation control layer configured to be more transparent in certain areas of the layer and less transparent in other areas. Alternatively, a plurality of tiles having a different transparency level may be used. Thereby, the one or more radiation control layers are able to control the exposure intensities to which the relief precursor is subjected to. The radiation control layer may be a film with areas of different optical density and where the intensity passing through the different areas is known. Such transmission step wedges are available e.g. from Stouffer Industries, Agfa or Kodak. Another possibility for a radiation control layer is to use a mask film wherein areas with different tonal values are represented. Such mask films can be obtained by ablating a non-transparent mask layer of by changing the transparency of a layer. The structure of the areas could be transparent lines or dots with a certain size and number per unit area such that only a defined portion of the applied light my pass. Such mask films are available e.g. form Miraclon (Flexcel) or Folex (LADF). The one or more radiation control layers are arranged between the electromagnetic radiation source and the relief precursor, e.g. directly against the relief precursor or against the support plate carrying the relief precursor or at a distance of the relief precursor. According to another possibility, the support plate can be implemented as a radiation control layer.

The exposure unit may comprise any light source known to the person skilled in the art. For example fluorescent light tubes, flash lights, mercury lamps, Xenon lamps, light emitting diodes (LED), light emitting screens (liquid crystal displays, plasma displays, organic light emitting displays), projection systems (micro mirror projection), lasers, or combinations thereof may be used.

Preferably, the exposure unit comprises a radiation source which radiates electromagnetic radiation in the range of 200 to 2000 nm, preferably 250 to 900 nm, more preferably 250 to 450 nm, most preferably 250 to 410 nm. The exposure unit is configured to expose the relief precursor with an exposure intensity or exposure intensities in the range of 1 to 2000 mW/cm$^2$, preferably 5 to 1000 mW/cm$^2$, more preferably 10 to 500 mW/cm$^2$, most preferably 10 to 250 mW/cm$^2$.

Preferably, the radiation source substantially extends in a plane intended for being parallel to the relief precursor. However, in other embodiments, the plane of the radiation source may be inclined relative to the plane parallel to the relief precursor.

According to an exemplary embodiment, the control module is configured to control the exposure time, such that the exposure time is varied while the exposure unit is configured and/or controlled to expose with a substantially constant exposure intensity. Preferably, the intensity is substantially constant over the area of the precursor, with a deviation of less than ±10%, preferably ±5%, more preferably ±2%.

According to another exemplary embodiment, the exposure unit may comprise an electromagnetic radiation source and a movable shutter between the relief precursor and the radiation source. The control module is configured to control a relative movement between the shutter and the relief precursor so as to control the exposure time, wherein the relative movement is preferably parallel to the relief precursor.

According to another exemplary embodiment, the control module is configured to control the movement of the shutter from a start position, wherein the shutter shields the area between the first position and the second position, in the direction of the second position, to an end position wherein the shutter allows full exposure of the area between the first and second positions.

The relative movement preferably occurs at one or more speeds in the range of 0.2 mm/sec to 50 mm/sec. This may allow an exposure time between 0.5 seconds to 15 minutes.

According to an exemplary embodiment, the control module is configured to vary the exposure intensity between different areas between the first and second positions. For example, the radiation source may be an array of LEDs comprising a plurality of subsets of one or more LEDs, each subset being individually controllable. The control module may be configured to control the plurality of subsets individually, and such that a radiation intensity variation in a predetermined surface area is within a predetermined range. More details about such exemplary embodiments can be found in patent application NL 2023537 in the name of the applicant, which is included herein by reference.

According to an exemplary embodiment, the optional development unit is configured to treat the non-exposed material of the relief precursor using a fluid and/or to heat the exposed precursor and transferring non-exposed material to another material, preferably a non-woven web.

According to an exemplary embodiment, the measuring unit is configured to measure the thickness of the developed precursor in a plurality of points between the first and second positions in order to obtain a thickness profile, and the determination module is configured to determine one or more points of the plurality of points representative for the desired feature based on said obtained thickness profile. The measuring unit may be able to move relatively to the relief precursor, preferably in a plane parallel to the precursor, however an inclined or perpendicular plane is also possible. In doing so, multiple measurements may be taken at a plurality of points on the relief precursor. The moving of the measuring unit may be done by a moving means. Alternatively, the relief precursor may be moved opposite the measuring unit. For example, a moving means may move the holding means and/or relief precursor relative to the measuring unit.

Preferably, the exposure unit comprises at least one of: a set of light tubes, preferably a set of fluorescent lamps, a plurality of LEDs, and combinations thereof.

In an exemplary embodiment the system may comprise a housing with an entrance and exit, and optionally the relief precursor may be automatically fed through the entrance to a position on a carrying structure, exposed, and next removed from the system through the exit. In other words, embodiments of the invention allow building a fully automated in-line system. The entrance and the exit may be at the same side or at opposite sides. The entrance and exit may be configured to be connected to other units.

The system may comprise a transport system for automatic transport of the relief precursor in a transport direction. The transport system may comprise a transport means selected from the group comprising an endless belt, a pair of chains or belts (with pushing blocks), a pair of lead screws, a creep drive, a friction drive, and combinations thereof.

The transport system may further comprise at least one attachment means to attach the relief precursor to the transport means. The attachment means may be a transport bar with a plurality of pins extending through an edge of the relief precursor. Alternatively a clamping means for clamping the relief precursor may be used. The transport bar may be configured to be coupled to a leading edge of the relief precursor, wherein the transport system is configured to pull the transport bar with the coupled relief precursor through the housing. When the transport system comprises two lead screws, the end portions of the transport bar may be provided with a coupling means adapted to be coupled to the lead screws.

In an exemplary embodiment the system further comprises a cooling means configured to cool the relief plate precursor and/or the exposure unit. For example, at least one cooling means may cool the electromagnetic radiation source and/or the holding means (for example a transparent plate) and/or a surface of the relief precursor and/or the shutter. The cooling means may use a fluid or gas for cooling, for example water or air.

Additional components may be part of the system. Such additional components may be selected from the group comprising a power source, an additional electromagnetic radiation source, a cooling system, a clamping means, an additional transport means, motors, sensors, and combinations thereof. The additional radiation source may be selected from the group comprising an LED, a fluorescent lamp, a flash lamp, a set of light tubes arranged in a linear fashion, a (scanning) laser, an LCD screen, a projection system (for example with movable mirrors), lasers and combinations thereof (these may be stationary and/or movable). The additional radiation source may be capable of irradiating at least a partial area, preferably the whole area of one or both surfaces of the relief precursor. The additional radiation source may be arranged so that the radiation source can move between the additional radiation source and the relief precursor. Optionally, there may be provided an additional radiation source on either side of the relief precursor. The additional radiation source may be controlled to expose the relief precursor before, during or after the exposure by the first radiation source.

Optionally, the control module controls components of the system as well as components of other units in a process chain. In that manner the various operations that need to be performed on the relief precursor may be coordinated. The control module may be a single centralized controller, or a distributed control module with multiple control units.

Optionally one or more sensors, such as light sensors, magnetic sensors, proximity sensors, temperature sensors, overheating sensors, flow sensors, intensity sensors, pressure sensors, thickness sensors etc., may be provided. The movement of the radiation source and the driving of the radiation source may then be further controlled in function of the sensor data measured by the one or more sensors. A sensor of the one or more sensors may be capable of detecting the size and/or thickness of the relief precursor and these data may be used to control for example the size of the exposed area, the exposure time and/or the exposure intensity.

Optionally, the system may comprise one or more additional treatment units selected from the group comprising loading and unloading units, an imaging unit, a liquid development unit, a thermal development unit, a drying unit, a post-treatment unit, a pre-treatment unit, a storage unit and combinations thereof.

According to a further aspect of the invention, there is provided a computer program comprising computer-executable instructions to control the values for the exposure, in particular the exposure time and/or the intensity, for a plurality of points between the first and second position such that the exposure time and/or the exposure intensity are varied automatically for said plurality of points, when the program is run on a computer. The controlling of the values for the exposure, in particular the exposure time and/or the intensity, may be done according to any one of the embodiments disclosed above.

According to a further aspect of the invention, there is provided a computer device or other hardware device programmed to control the values for the exposure, in particular the exposure time and/or the intensity, for a plurality of points between the first and second position such that the exposure time and/or the exposure intensity are varied automatically for said plurality of points. According to another aspect there is provided a data storage device encoding a program in machine-readable and machine-executable form to control the values for the exposure, in particular the exposure time and/or the intensity, for a plurality of points between the first and second position such that the exposure time and/or the exposure intensity are varied automatically for said plurality of points. The controlling of the values for the exposure, in particular the exposure time and/or the intensity, may be done according to any one of the embodiments disclosed above.

BRIEF DESCRIPTION OF THE FIGURES

The accompanying drawings are used to illustrate presently preferred non limiting exemplary embodiments of the system and method of the present invention. The above and other advantages of the features and objects of the invention will become more apparent and the invention will be better understood from the following detailed description when read in conjunction with the accompanying drawings, in which.

DETAILED DESCRIPTION OF EMBODIMENTS

Figures 1, 2:
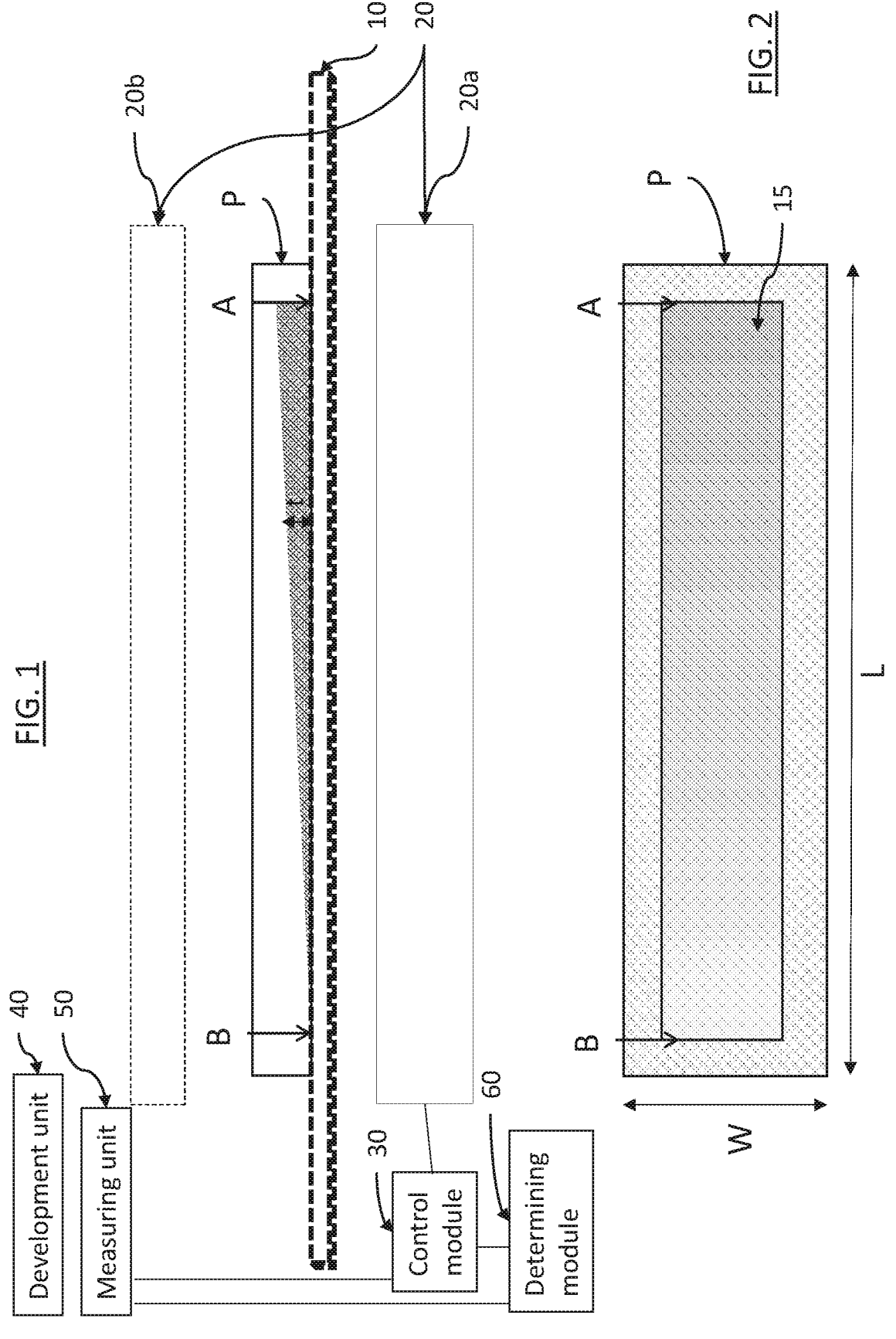
FIG. 1 illustrates schematically an exemplary embodiment of a system to determine exposure conditions, in particular an exposure time and/or exposure intensity to be used for obtaining a desired feature, more in particular a floor thickness of a printing plate or sleeve.
FIG. 2 is a schematic top view of a relief precursor with an exposed area between the first and second position A and B.

FIG. 1 schematically illustrates a system to determine an exposure time and/or exposure intensity to be used for obtaining a desired feature of a relief structure P, in particular a desired floor thickness t of a printing plate or sleeve. The system comprises a holding means 10, an exposure unit 20, a control module 30, optionally a development unit 40, a measuring unit 50 and a determining module 60.

The holding means 10 is configured to support the relief precursor P of which the backside is to be exposed by the exposure unit 20 with electromagnetic radiation between a first position A and a second B position of the precursor P, in particular between a first edge A of the exposed area and a second edge B of the exposed area. The holding means 10 may be a transparent plate, a glass plate, a frame, a hanging grip, a clamp or combinations thereof holding and/or supporting the relief precursor. A moving means (not shown) may be configured to move the relief precursor P relative to the exposure unit 20. The moving means may also be controlled by the control module 30.

The exposure unit 20 comprises a back exposure means 20a configured to expose the back side of the precursor P, preferably between said positions. Additionally or alternatively the exposure unit 20 may comprise a front exposure means 20b configured to expose the front side of the relief precursor P. Preferably the exposure unit 20 comprises any of the following: a plurality of LEDs, a set of light tubes, a fluorescent lamp, a flash lamp, a mercury lamp, a xenon lamp, a set of light tubes, a laser, a lightning screen for example an LCD-, an OLED- or a plasma-screen, a light projection system with movable mirrors, a sun light collection system, and combinations thereof.

The control module 30 is configured to control parameters of the exposure, in particular the exposure time and/or the intensity, for a plurality of points between the first and second positions A and B, such that the exposure time and/or the exposure intensity are varied for said plurality of points. The control module may further be configured to control other components of the system, e.g. a moving means for a movable light source or precursor, a shutter, a LED array, sensors, the measuring unit 50 and/or the development unit 40.

The development unit 40 is configured to develop the relief precursor in order to remove unexposed material. The development unit 40 is configured to wash the non-exposed material of the relief precursor using a fluid and/or to heat the exposed precursor and transferring non-exposed material to another material, preferably a non-woven web. Removal of material from the exposed precursor may be performed by heating and removal of liquefied material with a developing material, for example a web or film which is brought into contact with the precursor. Additionally or alternatively, the development unit 40 may be configured to develop the relief precursor by brushing, rinsing, drying and/or heating, treating the relief precursor with gases or liquids, or combinations thereof.

The measuring unit 50 is configured to measure the developed relief precursor in order to determine one or more points of said plurality of points which represent the desired feature. The measuring unit 50 may use different methods to measure, for example the thickness of the developed relief precursor, such as mechanical, optical and/or acoustic methods. Preferably a non-contact measurement method is used. The measuring unit 50 may use one or more sensors such as proximity sensors, pressure sensors, density sensors, preferably thickness sensors. Examples for mechanical sensors are a moving wheel, a moving stylus or plate, a spring or combinations thereof. Examples for non-contact sensors are spectral analyzing sensors, spectral reflectance analyzing sensors, chromatic confocal sensors, single channel or dual channel sensors, non-contact laser thickness gauges etc. Optionally, additional or alternative sensors may be provided such as light sensors, magnetic sensors, temperature sensors, overheating sensors, flow sensors, intensity sensors etc.

The determining module 60 is configured to determine the required exposure time and/or intensity in order to obtain the desired feature based on the determined one or more points and the values which are set by the control module 30.

The relief precursor P has an exposed area between a first position A and a second position B, wherein the exposed area between the positions comprises a wedge shape with a thickness profile. The wedge shape has a thickness that is decreasing as seen in the direction from the first position A to the second position B. Alternatively, different shapes are possible, as described in connection with FIG. 2 to FIG. 8C.

FIG. 2 illustrates a schematic top view of a relief precursor P having a length L and a width W. The first and second position A and B extend in the width direction of the relief precursor. Alternatively, the first and second positions may extend in a length direction or in a direction at an angle different from 90° with respect to the width direction of the relief precursor. Also, the positions A and B may be curved.

An exposed area between the first and second position A and B is shown illustrating a top view of the wedge discussed above in connection with FIG. 1. The first position A has been subjected to a longer exposure time and/or higher exposure intensity than the second position B. As seen in the length direction from A to B, the thickness gradually decreases due to a shorter exposure time and/or lower exposure intensity.

The length L of the precursor may be in the range of 10 mm to 2000 mm, preferably 20 to 1500 mm, more preferably 50 to 1000 mm, most preferably 50 to 350 mm.

The measurement unit 50 may measure a thickness profile between positions A and B for a plurality of points along the length L. Additionally, the measurement unit 50 may measure the thickness along a line extending in the width direction located at the plurality of points, such that the average of the measurements along said line may be used in order to create a thickness profile between positions A and B. Possible thickness profiles are illustrated in FIGS. 7A to 7E, wherein the thickness profiles are illustrated in a sectional view of the relief precursor. Alternatively, the measuring unit may measure the thickness across the entire upper surface of the exposed area. In this way a measured thickness profile in 2D is obtained.

The determining module 60 may be configured to receive the exposure time and the exposure intensity as a function of a position along a line between the first and second positions. In this way, the exposure time and the exposure intensity may be associated with the measured thickness profile for the plurality of points between the positions.

Figure 3:
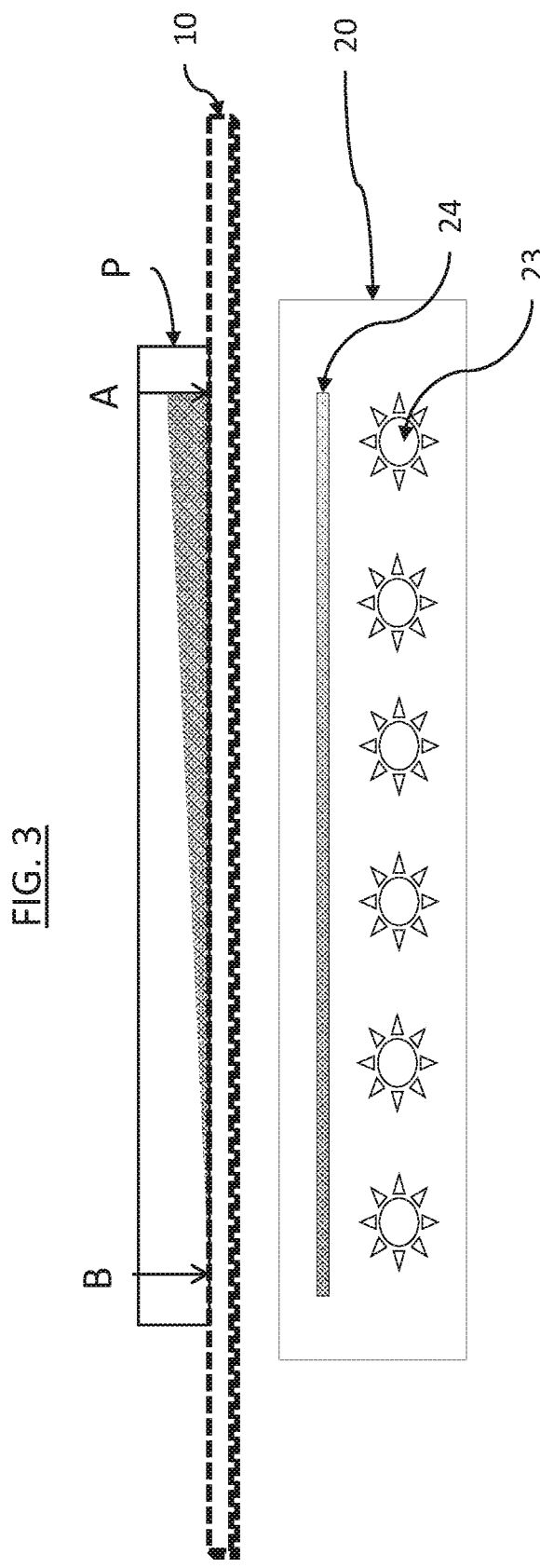
FIG. 3 is a simplified schematic side view of an exemplary embodiment of the invention wherein the exposure unit comprises a radiation control layer.

FIG. 3 illustrates a schematic side view of an exemplary embodiment similar to the embodiment of FIG. 1. The same or similar components have been indicated with the same reference numerals. The exposure unit 20 comprises a radiation source 23 and an optional radiation control layer 24. Alternatively, the holding means 10 may comprise the radiation control layer 24. The radiation source 23 radiates electromagnetic radiation in the range of 200 to 2000 nm, preferably 250 to 900 nm, more preferably 250 to 450 nm, most preferably 250 to 410 nm. The radiation source 23 is configured to expose the relief precursor with exposure intensities in the range of 1 to 2000 mW/cm², preferably 5 to 1000 mW/cm², more preferably 10 to 500 mW/cm², most preferably 10 to 250 mW/cm². The radiation source 23 may radiate with a substantially constant exposure intensity or the exposure intensity of the radiation source 23 may be varied. The electromagnetic radiation source 23 is preferably selected from the group comprising a LED, a fluorescent lamp, a flash lamp, a set of light tubes arranged in a linear fashion, a (scanning) laser, an LCD screen, a light projection system (with movable mirrors), and/or combinations thereof.

The radiation control layer 24 may be used to vary the exposure intensity to which the relief precursor is subjected to. The radiation control layer 24 may be configured to be more transparent to electromagnetic radiation near the first position A wherein the transparency of the control layer 24 gradually decreases near the position B. Alternatively the transparency of the radiation control layer 24 may vary differently, for example the transparency may decrease in a step wise manner.

Figures 10A, 10B, 10C:
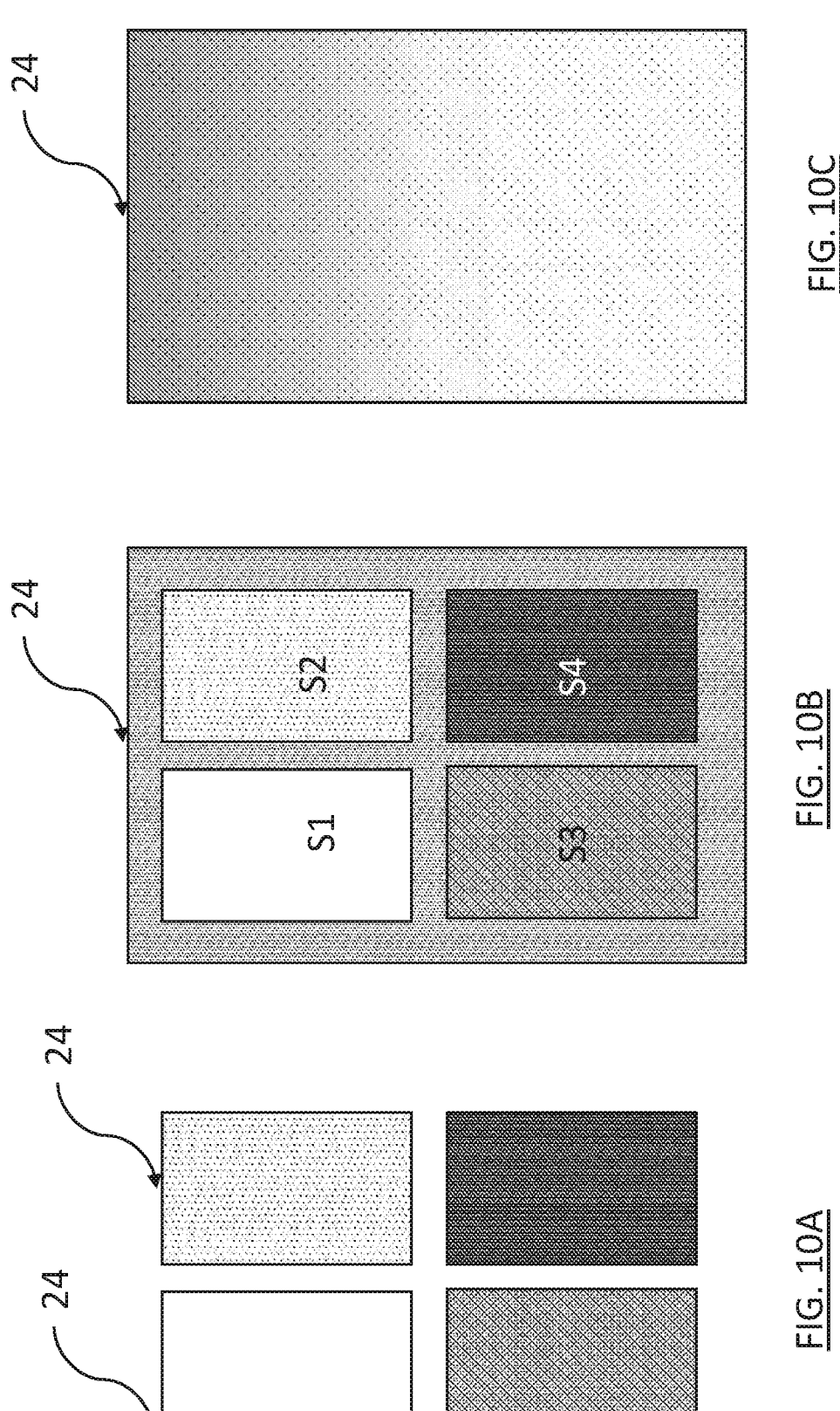
FIGS. 10A, 10B and 10C illustrate top views of three embodiments of radiations control layers.

FIGS. 10A, 10B and 10C illustrates three embodiments of radiations control layers. In the example of FIG. 10C, the radiation control layer 24 is configured to be more transparent in certain areas of the layer and less transparent in other areas. For example, the radiation control layer 24 may be a film with areas of different optical density where the intensity passing through the different areas is known. Such transmission step wedges are available e.g. from Stouffer Industries, Agfa or Kodak. For example, the degree of transparency may gradually increase in one direction.

In the example of FIG. 10A, multiple radiation control layers 24 shaped as tiles having a different degree of transparency are provided. Such tiles may be arranged e.g. against the first and/or second side of the relief precursor, depending on which side is to be exposed. The pattern of tiles 24 may comprise e.g. four tiles having four different degrees of transparencies.

In the example of FIG. 10B, the radiation control layer 24 is a mask film wherein areas S1, S2, S3, S4 with different tonal values are represented. Such mask films can be obtained by ablating a non-transparent mask layer or by changing the transparency of a layer. For example, the area 51 may be a hole (fully transparent), whilst the areas S2, S3, S4 may have different ablation depths. Such mask films are available e.g. form Miraclon (Flexcel) or Folex (LADF).

Figure 4:
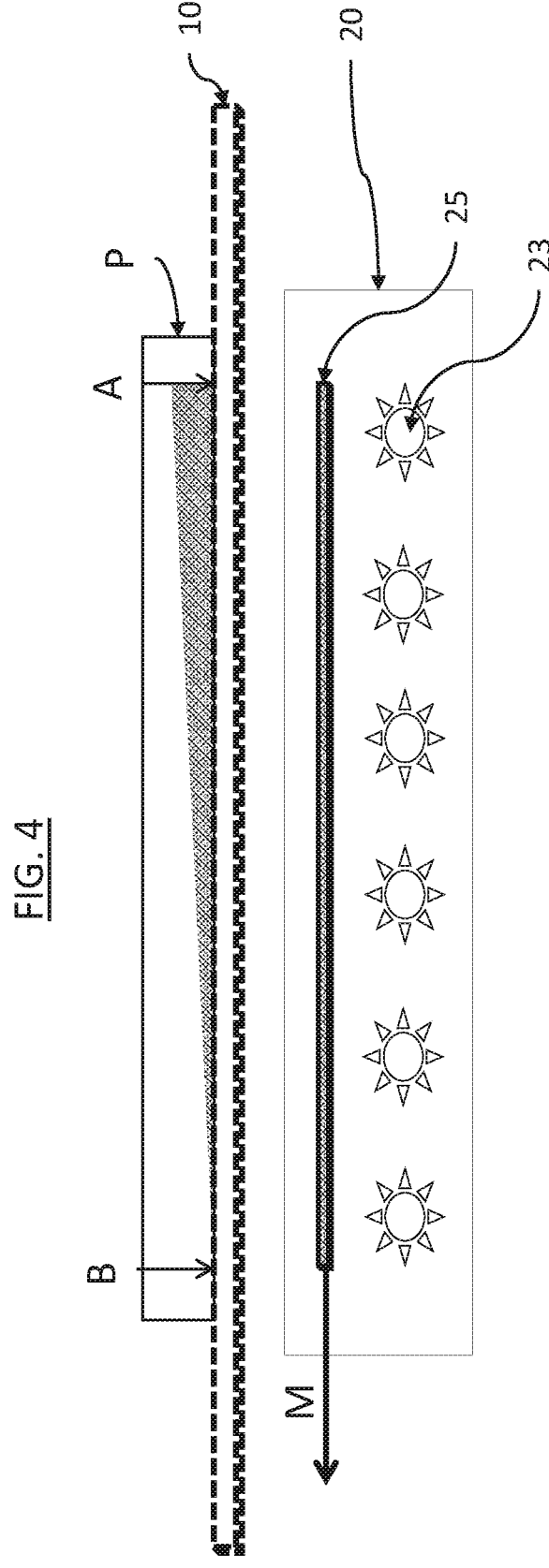
FIG. 4 is a simplified schematic side view of an exemplary embodiment of the invention wherein the exposure unit comprises a movable shutter.

FIG. 4 illustrates a schematic side view of an exemplary embodiment similar to the embodiment of FIG. 1. The same or similar components have been indicated with the same reference numerals. The exposure unit 20 comprises a movable shutter 25 and a radiation source 23.

The movable 25 shutter is preferably non-transparent and/or non-reflecting to electromagnetic radiation in the previously disclosed ranges. The shutter 25 is preferably a planar structure, e.g a sheet, a curtain, a folding sheet or combinations thereof, which is moved by moving means (not shown). The moving means may comprise any one of the group comprising an endless belt, a chain, a lead screw, a motor such as a linear motor, a piston, a toothed wheel such as a toothed wheel with cograil, a friction wheel, a gear, and combinations thereof.

The relative movement of the shutter 25 causes that a plurality of points between positions A and B are subjected to different exposure times. The movable shutter 25 may be moved with a constant speed, from a start position where the shutter shields the area between the first position A and the second position B, in the direction of the second position B, to an end position in which the shutter allows full exposure of the area between the first and second positions. In this way, a wedge shape is created. The relative movement may also be done in steps, thereby creating a cured area with a step wise thickness profile. Alternatively, the movement may be varied such that more complex shapes are formed.

Preferably, the shutter 25 is moved at a speed in the range of 0.2 mm/sec to 50 mm/sec, allowing an exposure time of the relief precursor P between 0.5 seconds to 15 minutes. For a portion of the trajectory of the relative movement where no exposure is required the speed may be higher.

Figure 5:
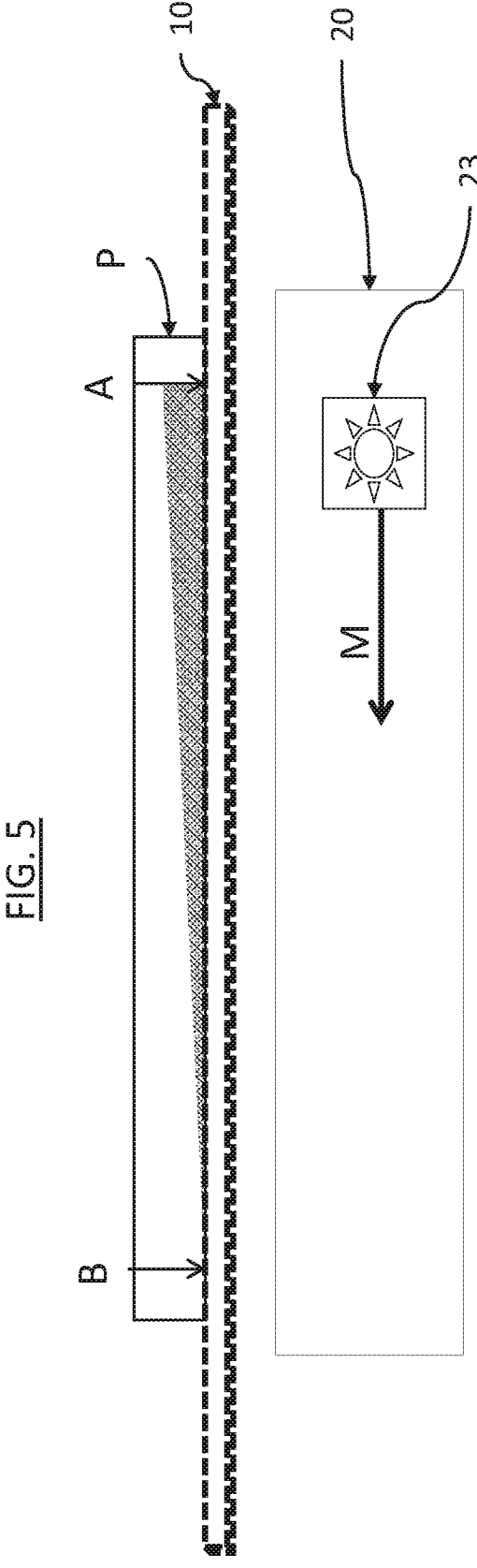
FIG. 5 is schematic side view of another exemplary embodiment of the invention illustrating an exposure unit with a movable radiation source.

Alternatively, another and/or different relative movement between the radiation source 23 and the relief precursor P may be provided by moving the holding means 10 and/or the relief precursor P itself. FIG. 5 illustrates a schematic side view of an exemplary embodiment similar to the embodiment of FIG. 1. The same or similar components have been indicated with the same reference numerals. The radiation source 23 in FIG. 5 is movable. The relative movement between the radiation source 23 and the relief precursor P causes different exposure times, hence a different thickness. The relative movement may be done at a constant acceleration in order to cause a gradual decrease in thickness between positions A and B. Alternatively, the movement of the radiation source 23 may be in steps causing a thickness with a staircase shape. The intensity of the radiation source 23 may be kept substantially constant or varied to create more complex shapes.

Figure 6:
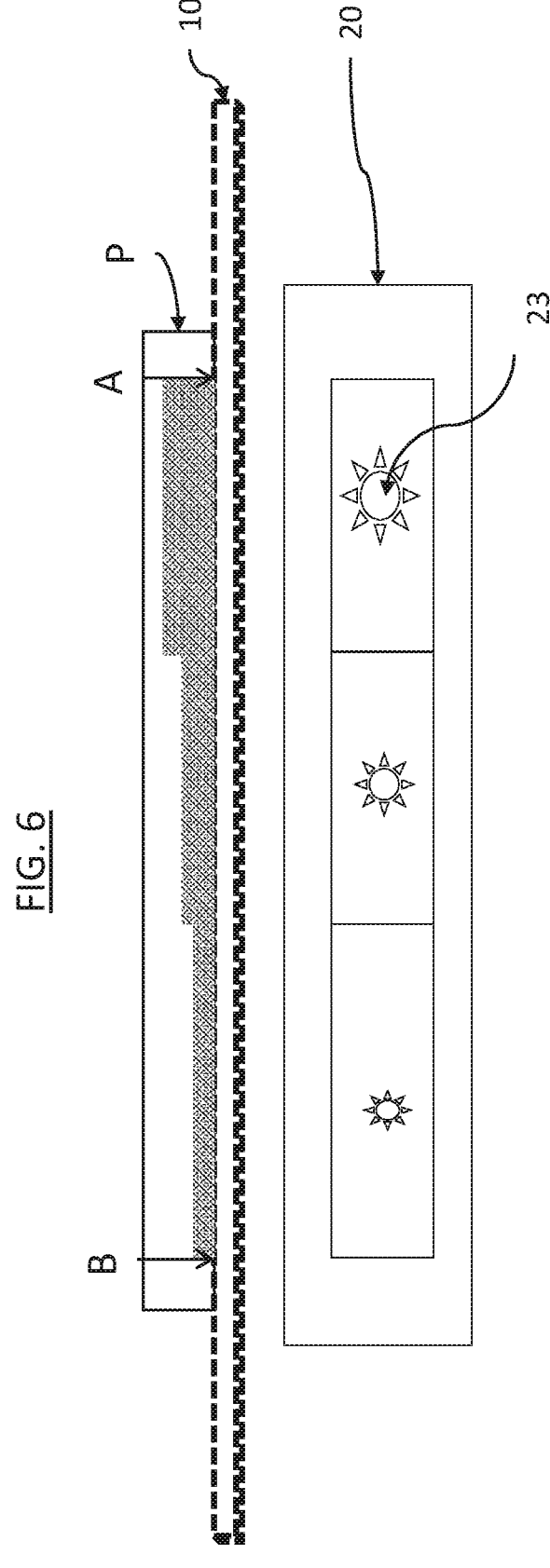
FIG. 6 is schematic side view of another exemplary embodiment of the invention illustrating an exposure unit with a radiation source radiating at different intensities.

FIG. 6 illustrates an embodiment similar to the embodiment of FIG. 1. The same or similar components have been indicated with the same reference numerals. The exposure unit 20 comprises three radiation sources 23 which are configured to radiate with different intensities, thereby creating a cured area with a step wise thickness profile. By exposing the relief precursor P with a constant decreasing intensity, a wedge shape may be obtained. Alternatively, the exposure unit 20 may comprise more than three radiation sources 23.

Figures 7A, 7B, 7C, 7D, 7E, 8A:
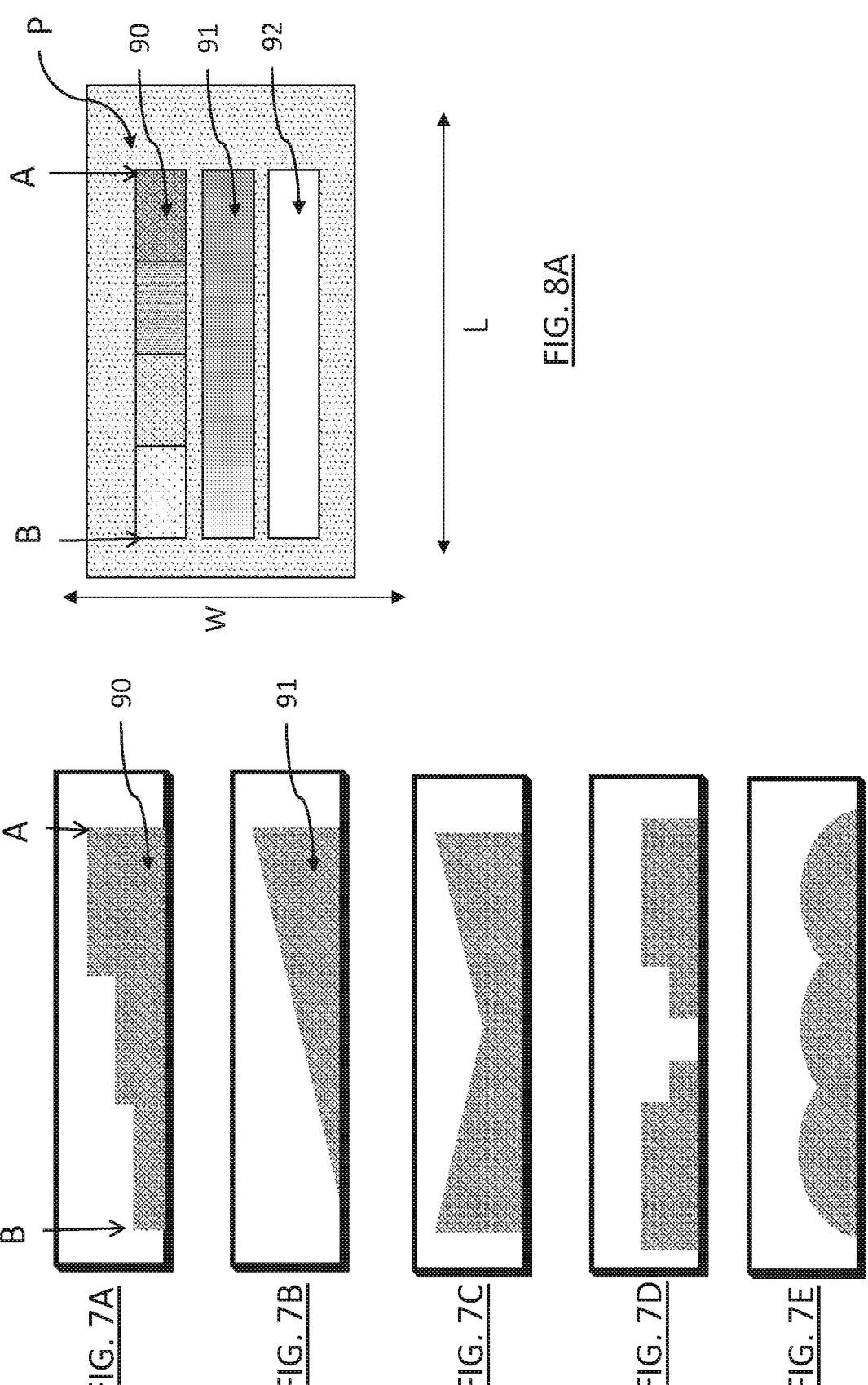
FIG. 7A to 7E are schematic side views of a relief precursor illustrating different possible thickness profiles.
FIG. 8A to 8C are schematic top views of an exposed relief precursor illustrating different areas exposed with different exposing conditions.

FIGS. 7A to 7B illustrate various possible thickness profiles. FIG. 7A illustrates a step wise thickness profile. FIG. 7B illustrates a wedge shaped thickness profile. FIG. 7C to 7E illustrate examples of more complex shapes resulting from different exposure times and/or exposure intensities to which a plurality of points between positions A and B have been subjected to.

FIG. 8A illustrates a top view of relief precursor P with length L and width W, with exposed areas 90, 91, 92 having different thickness profiles. Area 90 illustrates a step wise decrease in thickness from position A to position B. Area 91 illustrates a gradual decrease in thickness. Reference area 92 is a non-exposed or fully exposed area in order to serve as a control to which the measured thickness can be referenced and/or to be used in the calibration of the measuring unit 50.

Figures 8B, 8C:
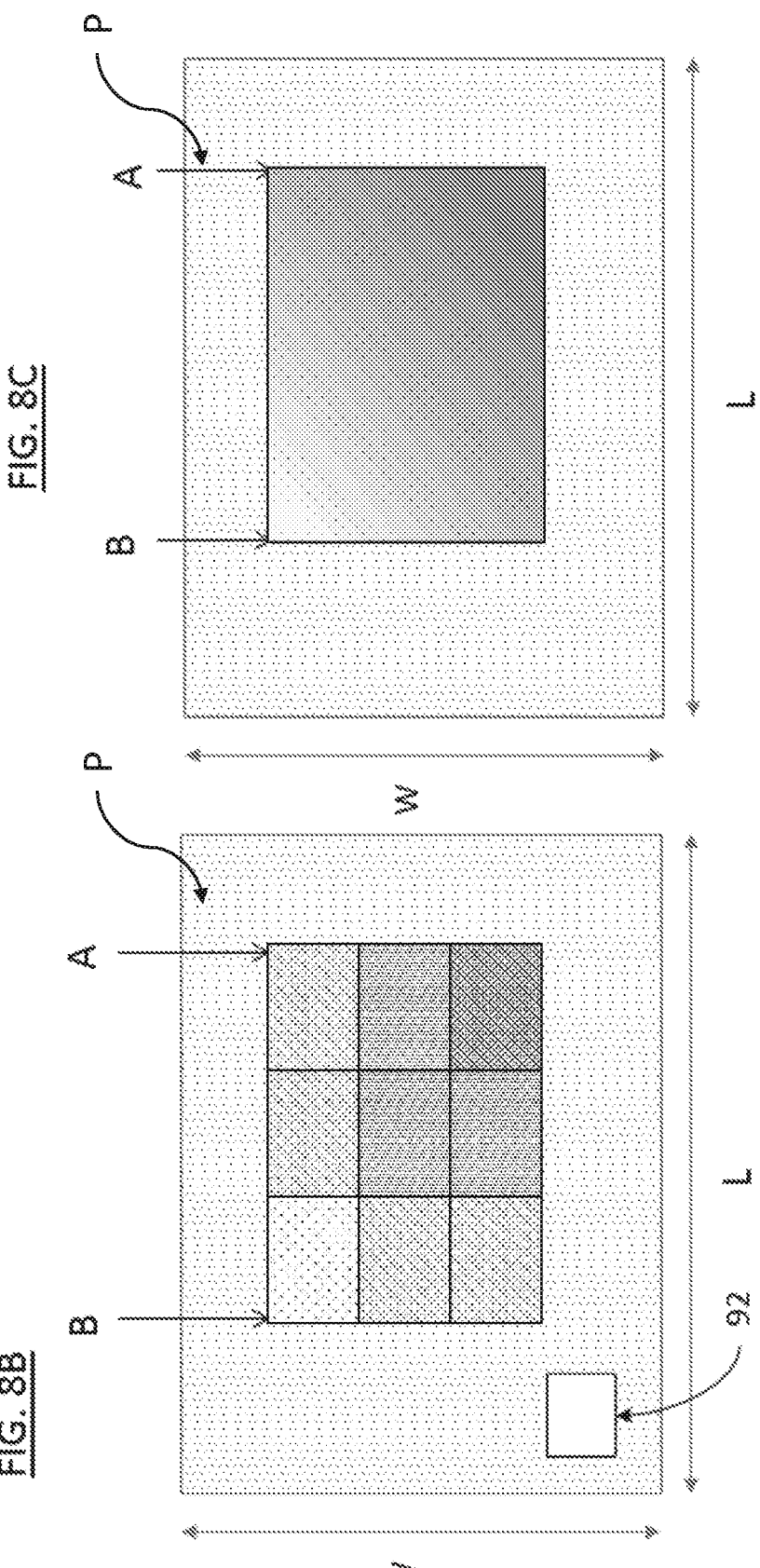

FIGS. 8B and 8C illustrate that the thickness may also be varied stepwise or gradually in two dimensions, due to varying exposure conditions, in a direction other than the length direction. In FIG. 8B the exposed area between positions A and B forms a grid wherein certain areas have been exposed with a higher intensity and/or longer exposure time. Reference area 92 may be used as a control to which the measured thickness may be referenced to. FIG. 8C illustrates that the thickness decreases gradually as seen from one point on the first position A towards one point on the second position B.

Figure 9:
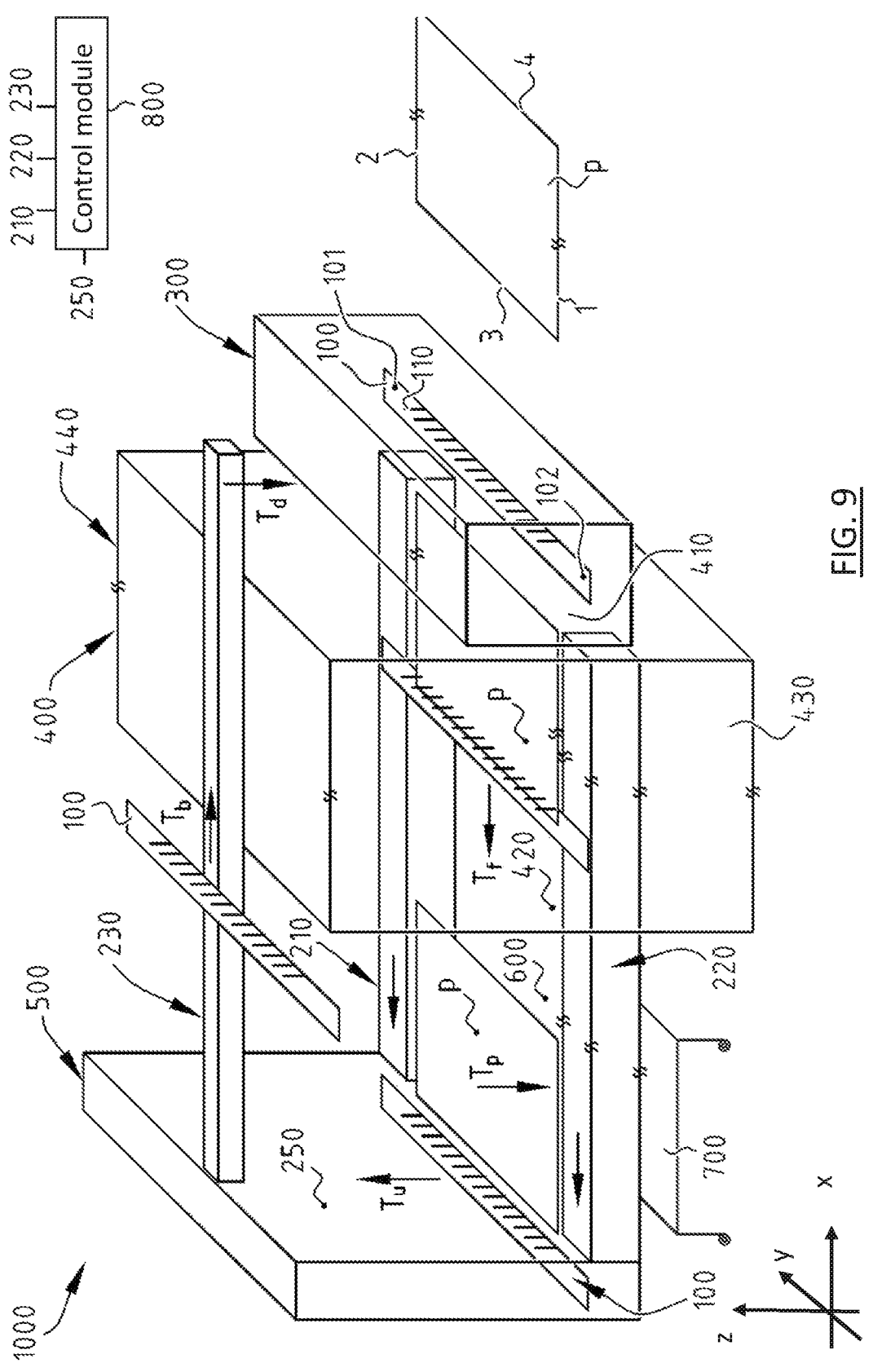
FIG. 9 illustrates a schematic perspective view of an exemplary embodiment of a system to expose and determine the exposure conditions of a relief precursor.

FIG. 9 illustrates schematically a system 1000 implementing the teachings of the system and method as described above.

The system 1000 comprises a transport system 210, 220, 230 with at least one, preferably at least two, and even more preferably at least three transport bars 100 intended to be coupled to a relief precursor. For example, four transport bars 100 may be provided to the transport system 210, 220, 230 as illustrated in FIG. 9. The transport bar 100 is coupled to a leading edge 3 of the relief precursor P and preferably extends over more than the entire length of the leading edge, such that end parts of the transport bar 100 can be coupled to a transport mechanism of the transport system 210, 220, see further. It is noted that it is also possible to couple a plurality of relief precursors to the transport bar 100. Preferably, the length of the transport bar 100 is between 100 mm and 1000 mm, more preferably between 1000 mm and 4000 mm.

The system 1000 comprises a plate coupling station 300 configured for coupling a relief precursor P to a transport bar 100, an exposure and development section 400 configured for exposing and developing the relief precursor. The exposure and development section 400 comprises the exposure unit 20 and development unit 40 as described above, in particular in connection to FIG. 1 and FIGS. 3-6.

The transport system 210 is controlled, for example using a control module 800, such that the transport bar 100 with the coupled relief plate precursor is moved through the exposure and development section 400 where the relief plate precursor P is exposed and developed.

Figure 11:
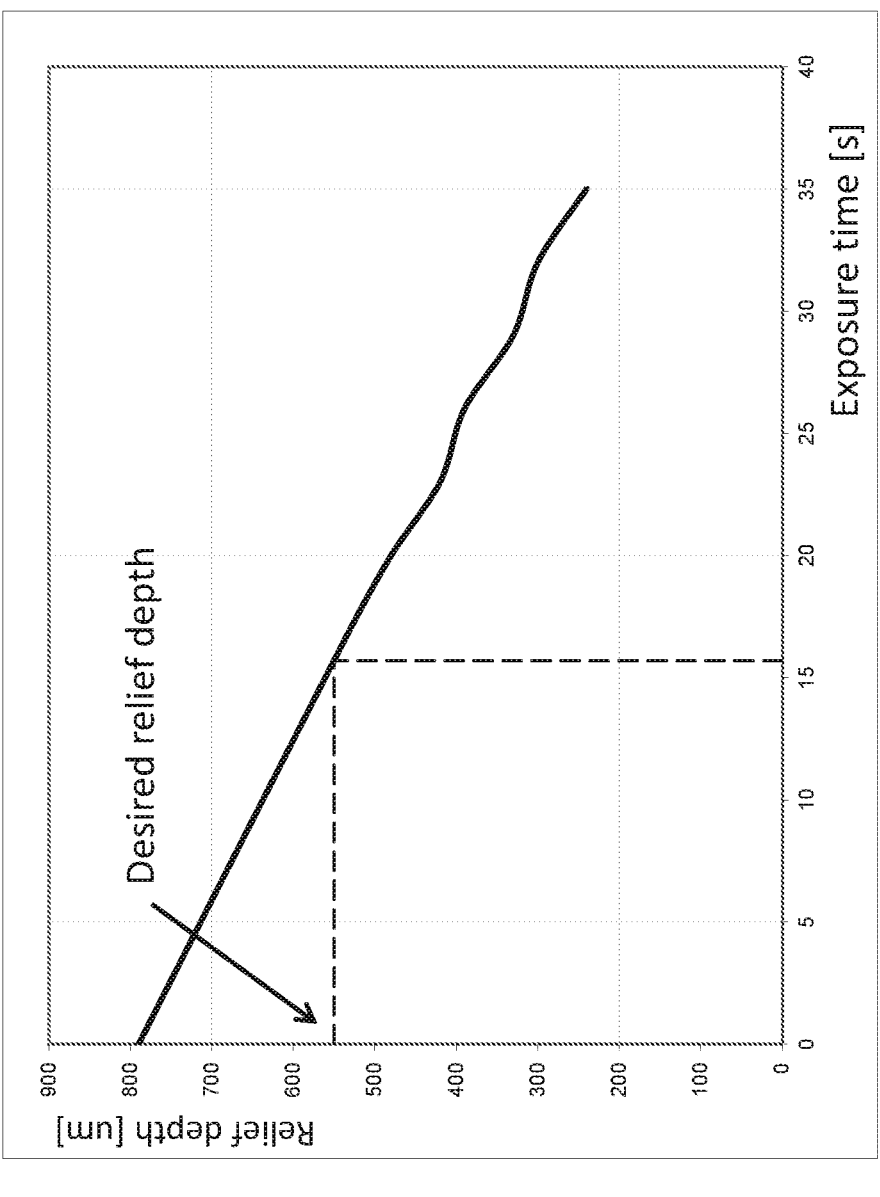
FIG. 11 illustrates an example of a calibration using an exemplary embodiment.

FIG. 11 illustrates an example of a calibration using an exemplary embodiment similar to the embodiment of FIG. 1. In the example of FIG. 11, first the desired development conditions were set, e.g. wash-out speed=350 mm/min, temperature=35° C., solvent=Nylosolv® A, etc. and next the backside of a plate was exposed using a variable exposure time in different positions of the plate. The exposure time was linearly varied and the relief depth (which corresponds with the plate thickness minus the floor height) was measured. The results are shown in the graph of FIG. 11. As can be seen, the relief depth decreases with the exposure time. Or stated differently, the floor height increases with the exposure time. In the example the target relief depth is 550 micron, so that the exposure time to be selected is approximately 16 s.

In non-illustrated embodiments, a post-treatment unit may be provided to perform a post-treatment on the relief precursor, for example drying, post-exposure, heating, cooling etc. Further, in non-illustrated embodiments, a pre-treatment unit may be provided to perform a pre-treatment on the relief precursor, said pre-treatment being selected from the group comprising: cutting, ablation, exposure to electromagnetic radiation, and combinations thereof.

Optionally a pre- or post-exposure may be performed using a radiation source selected from the group comprising an LED, a fluorescent lamp, a flash lamp, a set of light tubes arranged in a linear fashion, a (scanning) laser, an LCD screen, a light projection system (with movable mirrors), and combinations thereof. During the pre-exposure step a layer of the relief precursor may be altered in an image forming fashion.

A relief precursor generally comprises a support layer and at least one photosensitive layer. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 μm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, nonwoven or layered fibres (for example glass fibres, Carbon fibres, polymer fibres) or combinations thereof. Preferably polyethylene and polyester foils are used and their thickness may be in the range of about 100 to 300 μm, preferably in the range of 100 to 200 μm.

A relief precursor may carry at least one additional layer. For example, the additional layer may be any one of the following: a direct engravable layer (for example by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imagable layer is imaged. The one or more additional layers may comprise a relief layer, and an anti-halation layer between the support layer and the relief layer or at a side of the support layer which is opposite of the relief layer. The one or more additional layers may comprise a relief layer, an imagable layer, and one or more barrier layers between the relief layer and the imagable layer which prevent diffusion of oxygen. Between the different layers described above one or more adhesion layers may be located which ensure proper adhesion of the different layers.

In a preferred embodiment the relief precursor comprises a support layer made of a polyester of polymer material, and an additional layer made of a directly engravable material such as a resin material. The optional layer may then be a laser ablative layer. In an exemplary embodiment the relief precursor may contain at least a dimensionally stable support layer, a relief layer and an imagable mask layer. Optionally, further layers may be present. There may be a cover layer at the top of all other layers which is removed before the imagable mask layer is imaged. There may be an anti-halation layer between the support layer and the relief layer or it may be located at the side of the support layer which is opposite of the relief layer. There may be one or more barrier layers between the relief layer and the imagable mask layer which prevent diffusion of oxygen. Between the different layers described above one or more adhesion layers may be located which ensure proper adhesion of the different layers. One or more layers may be removable by treatment with a liquid. The liquids used may be the same or different for different layers. Preferably the liquids used are different.

In a preferred embodiment the relief precursor comprises a photosensitive layer and a mask layer. The mask layer may be ablated or changed in transparency during the treatment and forms a mask with transparent and non-transparent areas. Preferably the mask layer and/or the barrier layer are removed in the pre-washing section of the system because they may comprise material which could cause problems in further process steps or during use of the final relief. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble. In other cases the electromagnetic radiation may cause breaking of bonds or cleavage of protective groups rendering the irradiated areas more soluble. Preferably a process using photo-induced crosslinking and/or polymerization is used.

Liquids which may be used to remove material from the exposed precursor include amongst others: Water, aqueous solutions, solvents and combinations thereof. The nature of the liquid used is guided by the nature of the precursor employed. If the layer to be removed is soluble, emulsifiable or dispersible in water or aqueous solutions, water or aqueous solutions might be used. If the layer is soluble, emulsifiable or dispersible in organic solvents or mixtures, organic solvents or mixtures may be used. In the case of organically developable precursors different organic solvents or their mixtures may be used.

Removal of uncured material from the exposed precursor may also be performed by heating and removal of liquefied material with a developing material. The removal of softened material is achieved by continuously contacting it with an absorbing material. The absorbing developer material may be a non-woven of polyamide, polyester, cellulose or inorganic fibers onto which the softened material is adhering and subsequently removed. Such methods are described for example in U.S. Pat. Nos. 3,264,103, 5,175,072, WO 96/14603 or WO 01/88615. Alternatively WO 01/90818 proposed to treat the exposed relief precursor with a hot gas or fluid jet to remove the non-cured material. In EP-A 469 735 and WO 01/18604 devices capable to perform the above mentioned methods are described.

Whilst the principles of the invention have been set out above in connection with specific embodiments, it is to be understood that this description is merely made by way of example and not as a limitation of the scope of protection which is determined by the appended claims.

The invention claimed is:

1. A method to determine an exposure time and/or exposure intensity to be used for obtaining a desired feature of a relief structure, in particular a desired floor thickness, said method comprising the steps:
   a. exposing a first side of a relief precursor with electromagnetic radiation wherein the exposure is done in an area having a first position A and a second position B and is performed such that for a plurality of points between said first and second positions A, B the values for the exposure time and the exposure intensity are known and wherein the exposure time and/or the exposure intensity are automatically controlled to be varied at said plurality of points; wherein the exposing is done continuously in a direction between positions A and B, thereby forming a continuously exposed area between the first and second positions A and B,
   b. optionally exposing a second side of the relief precursor in a portion between the first position A and the second position B;
   c. optionally developing the relief precursor by removing non-exposed material thereof,
   d. optionally drying of the developed relief precursor,
   e. optionally curing of the developed relief precursor,
   f. determining one or more points of said plurality of points representative for the desired feature; and
   g. determining the required exposure time and/or exposure intensity for the desired feature based on the determined one or more points and the known values.

2. The method of claim 1, wherein the first side is the backside and the desired feature is a desired floor thickness.

3. The method of claim 1, wherein, the method comprises the step of developing the relief precursor by removing non-exposed material thereof and wherein the step of determining one or more points of said plurality of points representative for the desired feature is done after the step of developing.

4. The method of claim 1, wherein the exposure time and the exposure intensity are known as a function of a position along a line between the first and second positions A and B.

5. The method of claim 1, further comprising, before the optional developing step, exposing a first reference area from the first side during a maximum exposure time at a predetermined intensity and/or not exposing a second reference area from the first side, and, after the developing step, checking the first and/or second reference area, and optionally based thereon determining a correction factor if needed, wherein preferably the second reference area is covered by a layer which is non-transparent for electromagnetic radiation.

6. The method of claim 1, further comprising, before the optional developing step, exposing a third reference area from the second side during a predetermined exposure time at a predetermined intensity and, after the developing step, checking the third reference area, and optionally based thereon determining a correction factor if needed; wherein preferably the second side of the precursor is covered by a layer which is non-transparent for electromagnetic radiation and the third reference area is not covered by the layer or the layer is transparent to electromagnetic radiation in the area above the third reference area and wherein optionally the third reference area overlaps at least partially with the exposed area between positions A and B and/or with the first or second reference area.

7. The method of claim 1, wherein during the step of exposing the exposure intensity is varied by exposing different areas between first and second positions A and B with a different exposure intensity.

8. The method of claim 1, wherein the step of exposing is done by an exposure unit comprising an electromagnetic radiation source and a movable shutter between the relief precursor and the electromagnetic radiation source, and wherein during the step of exposing, the exposure time is controlled by relative movement of the shutter relative to the relief precursor, wherein the relative movement is preferably parallel to the relief precursor;
   wherein during exposure the shutter is moved from a start position where the shutter shields the area between the first position A and the second position B, in the direction of the second position B, to an end position in which the shutter allows full exposure of the area between the first and second positions A and B.

9. The method of claim 1, wherein exposure with electromagnetic radiation is performed through one or more radiation control layers configured for at least partially blocking or reducing radiation emitted by the electromagnetic radiation source to the relief precursor P; wherein the developing of the relief precursor is done by treating the non-exposed material using a fluid and/or by heating the exposed precursor and transferring non-exposed material to another material, preferably a non-woven web.

10. The method of claim 1, wherein a thickness of the developed precursor is measured in a plurality of points between first and second positions A and B in order to obtain a thickness profile, and wherein the step of determining one or more points of said plurality of points representative for the desired feature is based on the obtained thickness profile.

11. The method of claim 1, wherein the relief precursor has a length direction and a width direction, and wherein the first and second positions correspond with a first and second edge extending in the width direction of the relief precursor; and/or wherein the step of determining one or more points of said plurality of points representative for the desired feature comprises measuring a thickness of the developed relief precursor by any one of the following methods: mechanical, optical and/or acoustic methods, preferably a non-contact method.

12. The method of claim 1, wherein during the step of exposing the exposure intensity is constant and the exposure time is varied.

13. A method to determine an exposure time and/or exposure intensity to be used for obtaining a desired feature of a relief structure, in particular a desired floor thickness, said method comprising the steps:
   a. exposing a first side of a relief precursor with electromagnetic radiation wherein the exposure is done in an area having a first position A and a second position B and is performed such that for a plurality of points between said first and second positions A, B the values for the exposure time and the exposure intensity are known and wherein the exposure time and/or the exposure intensity are automatically controlled to be varied at said plurality of points; wherein the step of exposing is performed such that a developed relief precursor having substantially the shape of a wedge is obtained,
   b. optionally exposing a second side of the relief precursor in a portion between the first position A and the second position B;
   c. optionally developing the relief precursor by removing non-exposed material thereof,
   d. optionally drying of the developed relief precursor,
   e. optionally curing of the developed relief precursor, f. determining one or more points of said plurality of points representative for the desired feature; and g. determining the required exposure time and/or exposure intensity for the desired feature based on the determined one or more points and the known values.

14. A method for manufacturing a relief structure, comprising the method of claim 1, and using of the determined exposure time and/or exposure intensity for the manufacturing of relief structures; wherein preferably the relief structure is a flexographic printing plate, a letter press plate, a relief printing plate, a flexible printed circuit board, an electronic element, a microfluidic element, a micro reactor, a phoretic cell, a photonic crystal, an optical element or a Fresnel lens.

15. A system configured to determine an exposure time and/or exposure intensity to be used for obtaining a desired feature of a relief structure, in particular a desired floor thickness, said system comprising:

a holding means configured to support a relief precursor P;

an exposure unit configured to expose a first side of the relief precursor with electromagnetic radiation, between a first position A and a second position B of the precursor; and optionally configured to expose a second side of the relief precursor in a portion between the first position A and the second position B;

a control module configured to control the values for the exposure time and/or the exposure intensity in at least a plurality of points between the first and second position A and B such that the exposure time and/or the exposure intensity are varied along said plurality of points; wherein the control module is configured to control the exposure unit such that the exposing is done continuously in a direction between the first and second positions, thereby forming a continuously exposed area between the first and second positions;

optionally a development unit configured for developing the exposed relief precursor in order to remove unexposed material;

a measuring unit configured to measure the optionally developed relief precursor in order to determine one or more points of said plurality of points representative for the desired feature; and a determining module configured for determining the required exposure time and/or exposure intensity for the desired feature based on the determined one or more points and the values set by the control module.

16. The system of claim 15, wherein the exposure unit comprises a back-exposure means configured to expose the backside of the relief precursor and wherein the desired feature is a desired floor thickness.

17. The system of claim 15, wherein the determining module is configured to receive the exposure time and/or the exposure intensity as a function of a position along a line between the first and second positions A and B; wherein preferably the function received by the determining module is a linear function or a step function.

18. The system of claim 17, wherein the function received by the determining module is a linear function.

19. The system of claim 15, wherein the exposure unit comprises an electromagnetic radiation source and one or more radiation control layers configured for at least partially blocking or reducing radiation emitted by the electromagnetic radiation source to the relief precursor P; and/or wherein the control module is configured to vary the exposure intensity between different areas between the first and second positions; and/or wherein the control module is configured to control the exposure time, such that the exposure time is varied, wherein exposure unit is configured to expose with a constant exposure intensity; and/or wherein the measuring unit is configured to measure the thickness of the developed precursor in a plurality of points between the first and second positions A and B in order to obtain a thickness profile, and the determination module is configured to determine one or more points of said plurality of points representative for the desired feature based on said obtained thickness profile.

20. The system of claim 15, wherein the exposure unit comprises a electromagnetic radiation source and a movable shutter between the relief precursor P and the radiation source, wherein the control module is configured to control a relative movement M between the shutter and the relief precursor so as to control the exposure time, wherein the relative movement is preferably parallel to the relief precursor; wherein the control module is configured to control the movement of the shutter from a start position, wherein the shutter shields the area between the first position A and the second position B, in the direction of the second position B, to an end position wherein the shutter allows full exposure of the area between the first and second positions.

* * * * *